United States Patent
Choo et al.

(10) Patent No.: US 7,701,744 B2
(45) Date of Patent: Apr. 20, 2010

(54) METHOD OF ARRANGING FUSES IN A FUSE BOX OF A SEMICONDUCTOR MEMORY DEVICE AND A SEMICONDUCTOR MEMORY DEVICE INCLUDING SUCH AN ARRANGEMENT

(75) Inventors: Chul-hwan Choo, Paju-si (KR); Hi-choon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 224 days.

(21) Appl. No.: 11/976,125

(22) Filed: Oct. 22, 2007

(65) Prior Publication Data

US 2008/0101141 A1    May 1, 2008

(30) Foreign Application Priority Data

Oct. 26, 2006    (KR) ...................... 10-2006-0104682

(51) Int. Cl.
    *G11C 17/00*    (2006.01)
(52) U.S. Cl. .................. 365/96; 365/230.03; 365/225.7
(58) Field of Classification Search .................. 365/96, 365/230.03, 225.7, 200, 189.05, 163, 185.18
    See application file for complete search history.

(56) References Cited

U.S. PATENT DOCUMENTS

| | | | | |
|---|---|---|---|---|
| 6,542,418 | B2 * | 4/2003 | Braceras et al. | 365/200 |
| 6,674,675 | B2 * | 1/2004 | Takase | 365/200 |
| 7,227,801 | B2 * | 6/2007 | Kikutake et al. | 365/225.7 |
| 2003/0206452 | A1 * | 11/2003 | Kato et al. | 365/200 |

FOREIGN PATENT DOCUMENTS

| KR | 102005010687 A | 11/2005 |
|---|---|---|
| KR | 1020060004196 A | 1/2006 |
| KR | 1020060075290 A | 7/2006 |

* cited by examiner

*Primary Examiner*—Dang T Nguyen
(74) *Attorney, Agent, or Firm*—Harness, Dickey & Pierce, P.L.C.

(57) ABSTRACT

A semiconductor memory device may include a memory cell array and at least one fuse box. The memory cell array may include a plurality of sub-array blocks, and a fuse box may include a plurality of fuse groups, each group corresponding to a sub-array block. Each fuse group may have a plurality of fuses, wherein the fuses are intermittently arranged such that fuses of the same fuse group are not adjacent to each other. Each fuse group may further include a master fuse and a fuse mode determining circuit for determining a fuse-on-mode or a fuse-off-mode for the repair operation of a sub-array block. Consequently, during a repair operation using a conventional laser having a relatively large beam spot, the designated fuse of one fuse group as well as adjacent fuses of a different group may be cut without hindering the repair operation of the sub-array block. Accordingly, increasing the pitch size of the fuses to accommodate the relatively large beam spot of a conventional laser may not be necessary, thus allowing a reduction in the size of the fuse box (and the overall semiconductor memory device). Additionally, the above fuse arrangement may reduce costs by permitting the use of conventional laser equipment instead of more expensive laser equipment having a relatively small beam spot.

15 Claims, 5 Drawing Sheets

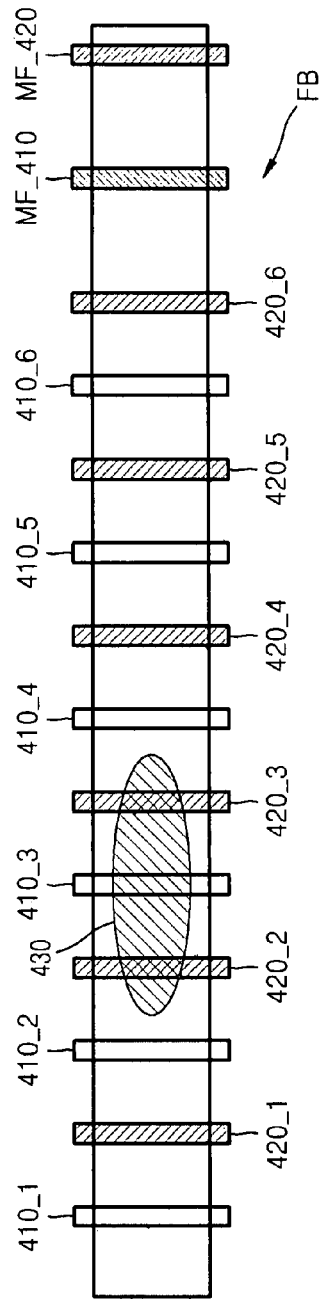
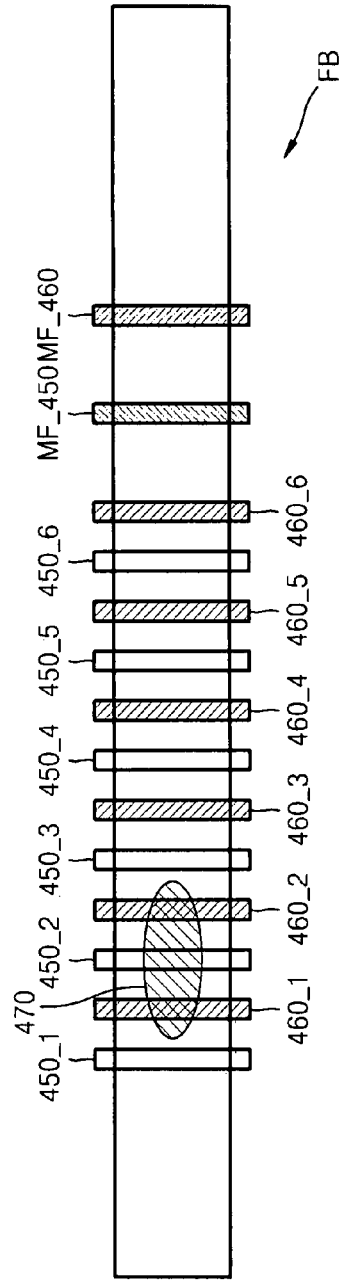
FIG. 4A
FIG. 4B

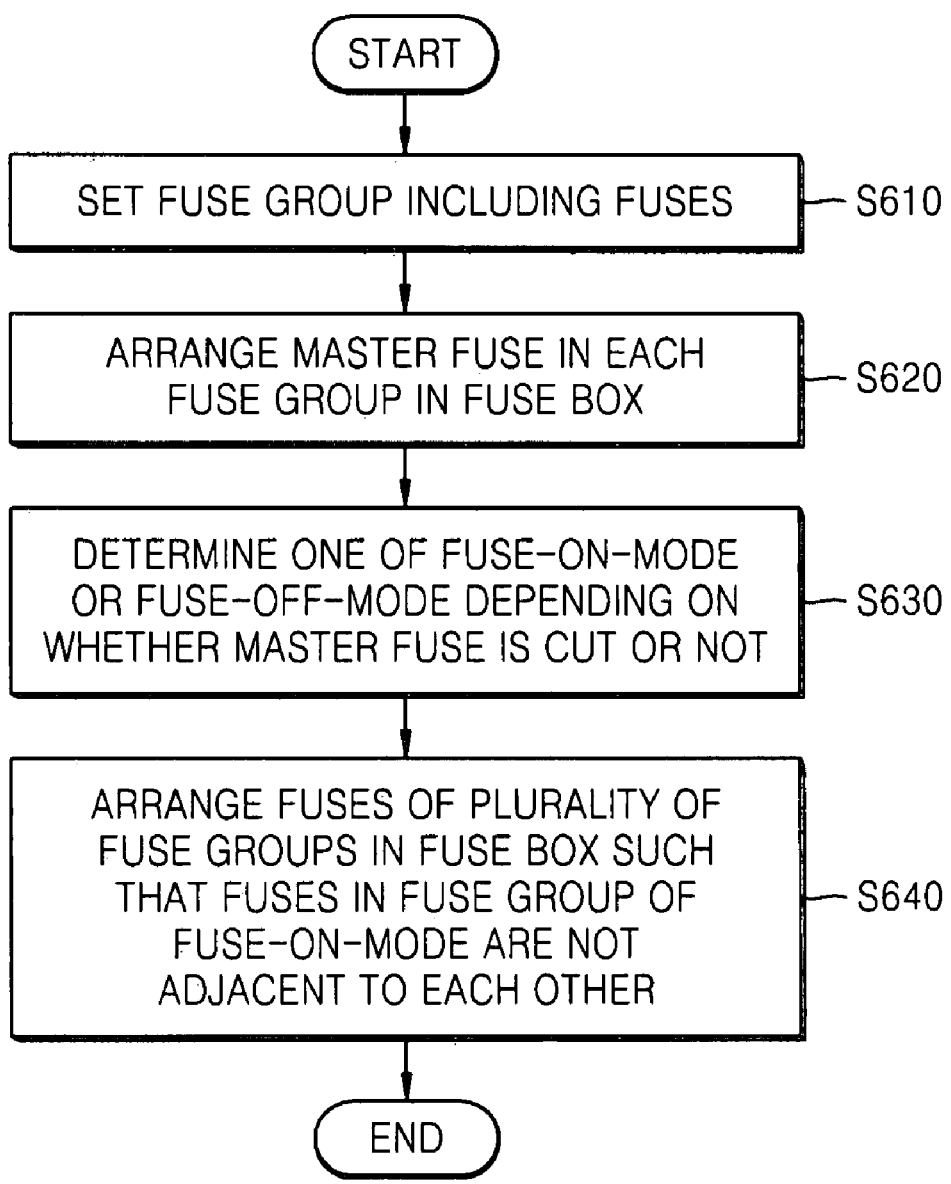

METHOD OF ARRANGING FUSES IN A FUSE BOX OF A SEMICONDUCTOR MEMORY DEVICE AND A SEMICONDUCTOR MEMORY DEVICE INCLUDING SUCH AN ARRANGEMENT

PRIORITY STATEMENT

This application claims priority under 35 U.S.C. §119 to Korean Patent Application No. 10-2006-0104682, filed on Oct. 26, 2006 in the Korean Intellectual Property Office (KIPO), the entire contents of which are incorporated herein by reference.

BACKGROUND

1. Technical Field

Example embodiments relate to a method of arranging fuses in a fuse box of a semiconductor memory device and a semiconductor memory device including such an arrangement.

2. Description of the Related Art

A semiconductor memory device may not function properly because one of its memory cells has a defect. Consequently, an entire memory device may be discarded merely because of a defect in one or a small number of its memory cells, thus decreasing manufacturing yield. However, a defective memory device may be salvaged by replacing the defective cell with a redundancy cell in the memory device. A repair operation may be performed by positioning a spare row array and a spare column array in each sub-array block of the semiconductor memory device and replacing the defective memory cell with a spare redundancy cell. Thus, the repair operation may be performed by selecting a defective memory cell and changing the relevant address of the defective memory cell to the address signal of a redundancy cell with a programming operation. The programming operation may include an electric fusing method of melting and cutting fuses using over current, a method of burning and cutting fuses using a laser beam, and a method of shorting a junction using a laser beam.

FIG. 1 is a block diagram of a conventional semiconductor memory device 100. Referring to FIG. 1, the conventional semiconductor memory device 100 may include a memory cell array 110 and two sets 150 and 160 of fuse boxes (FBs). The memory cell array 110 may include a plurality of sub-array blocks (SABs), and each SAB may include normal cells and redundancy cells. Each FB may include a plurality of fuses. When a defect occurs in a cell in one of the SABs, the appropriate fuse may be fused, and the row address/column address of the defective cell may be replaced with the row address/column address of a redundancy cell, thus replacing the defective cell with the redundancy cell.

FIG. 2 illustrates the structure of the fuse box (FB) of FIG. 1. Referring to FIG. 2, the FB may include a plurality of fuses 210, 220, 230, 240, 250, and 260. The interval between two adjacent fuses may be called a pitch. When the pitch is relatively small, two or more fuses may be inadvertently included in the spot 290 of a laser beam during the cutting of the appropriate fuse. Because the spot 290 of the laser beam may inadvertently cut one or more adjacent fuses during the process of cutting the appropriate fuse, proper performance of the repair operation may be hindered. Accordingly, it may be necessary to use laser equipment having a relatively small spot size, which may be relatively expensive, to accommodate the relatively small pitch size of conventional scaled-down semiconductor memory devices. Alternatively, the pitch size may be increased such that only one fuse is included in the spot 290 of a laser beam generated by conventional laser beam equipment. However, increasing pitch size will consequently increase the size of the memory device.

SUMMARY OF EXAMPLE EMBODIMENTS

A semiconductor memory device may include a memory cell array having a plurality of sub-array blocks and at least one fuse box having a plurality of fuse groups. Each fuse group may have a plurality of fuses and may correspond to one of the sub-array blocks. The fuses of the different fuse groups may be arranged intermittently such that the fuses in the same fuse group are not adjacent to each other. For example, where there are two fuse groups in a fuse box, the fuses of the two groups may be arranged alternately.

Each of the fuse groups may further include at least one master fuse, wherein the integrity (e.g., not cut, cut) of the master fuse of a fuse group affects the determination of a fuse mode for the repair operation of a sub-array block corresponding to the fuse group. The fuse mode may be a fuse-on-mode when the master fuse of the fuse group has not been cut. On the other hand, the fuse mode may be a fuse-off-mode when the master fuse of a fuse group has been cut, even though one or more fuses of the fuse group have also been cut. Additionally, the pitch size between the master fuses may be greater than the pitch size between the fuses.

The semiconductor memory device may further include a fuse mode determining circuit that determines a fuse mode (e.g., fuse-on-mode, fuse-off-mode) by outputting a redundancy enable signal in response to the integrity status (e.g., not cut, cut) of the master fuse. The fuse mode determining circuit may include an inverter outputting an input signal after changing a logic state of the input signal depending on the integrity status of the at least one master fuse; a latch part latching the changed input signal outputted by the inverter; and a logic gate outputting a redundancy enable signal by logic operation of an output signal of the latch part and address data. The fuse mode determining circuit may determine a fuse-on-mode when the master fuse is not cut and may output a redundancy enable signal at a first logic state (e.g., high logic state). On the other hand, the fuse mode determining circuit may determine a fuse-off-mode when the at least one master fuse is cut and may output a redundancy enable signal at a second logic state (e.g., low logic state).

A method of arranging fuses in a fuse box of a semiconductor memory device may include providing a memory cell array having a plurality of sub-array blocks and providing at least one fuse box having a plurality of fuse groups. Each fuse group may have a plurality of fuses and may correspond to one of the sub-array blocks. The fuses of the different fuse groups may be arranged intermittently such that the fuses in the same group are not adjacent to each other. The method may also include providing at least one master fuse corresponding to each of the fuse groups, wherein the integrity of the master fuse of a fuse group affects the determination of a fuse mode for the repair operation of a sub-array block corresponding to the fuse group. The method may further include determining a fuse mode for the repair operation of a sub-array block corresponding to the fuse group in response to the integrity status of the master fuse of the fuse group. The fuse mode may be determined to be a fuse-on-mode when the master fuse of the same fuse group has not been cut. The fuse mode may be determined to be a fuse-off-mode when the master fuse of a fuse group has been cut, even though at least one or more fuses of the same fuse group have also been cut.

BRIEF DESCRIPTION OF THE DRAWINGS

FIGS. 4A and 4B are views illustrating the structure of a fuse box of FIG. 3 according to example embodiments.

FIG. 6 is a flow chart illustrating a method of arranging fuses in a fuse box of a semiconductor memory device according to example embodiments.

DETAILED DESCRIPTION OF EXAMPLE EMBODIMENTS

Figure 1:
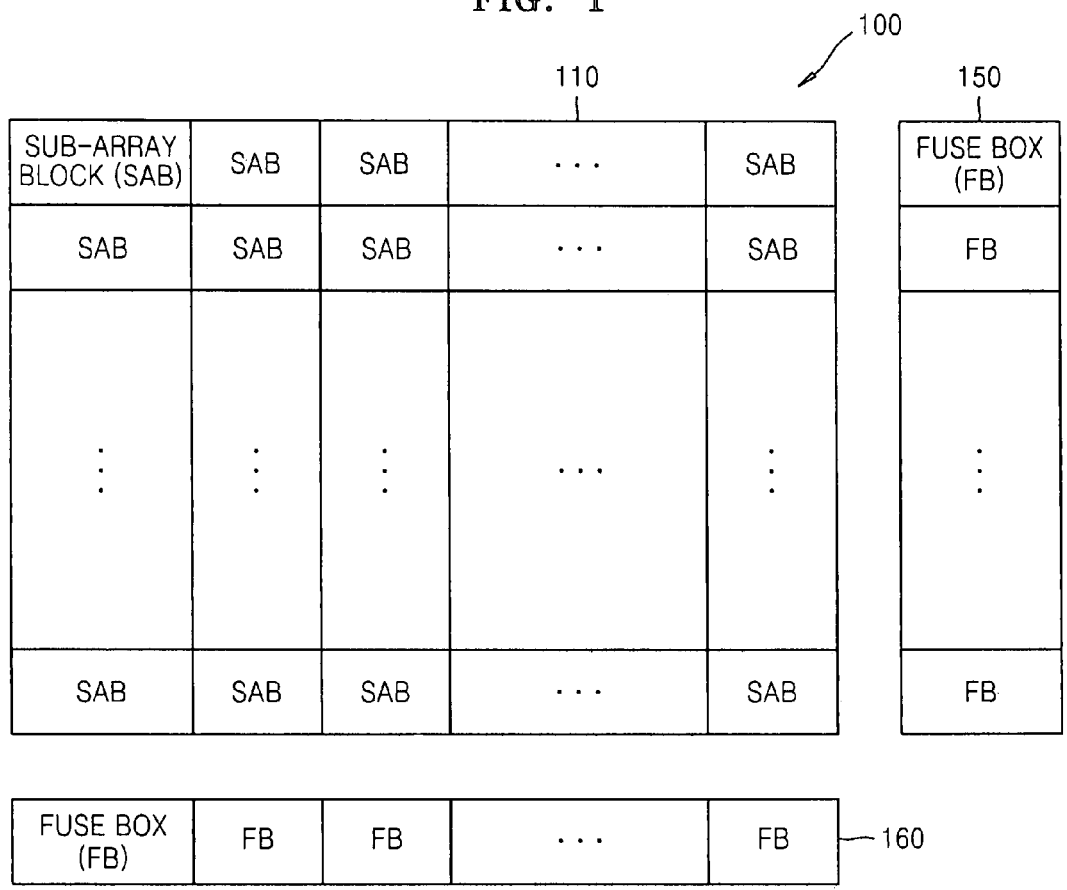
FIG. 1 is a block diagram of a conventional semiconductor memory device.
Figure 2:
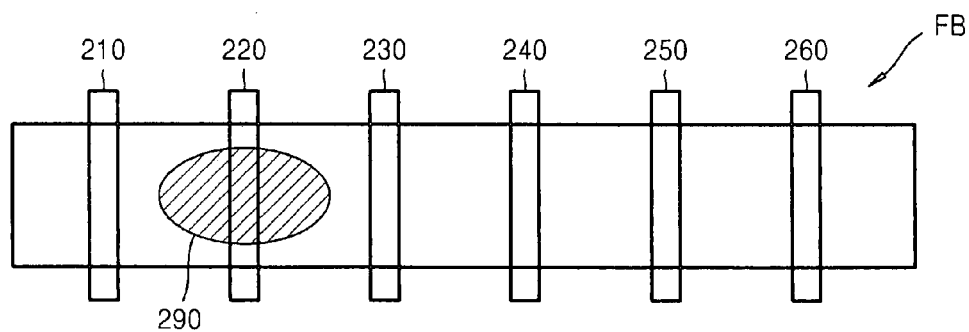
FIG. 2 is a view illustrating the structure of a conventional fuse box of FIG. 1.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 3:
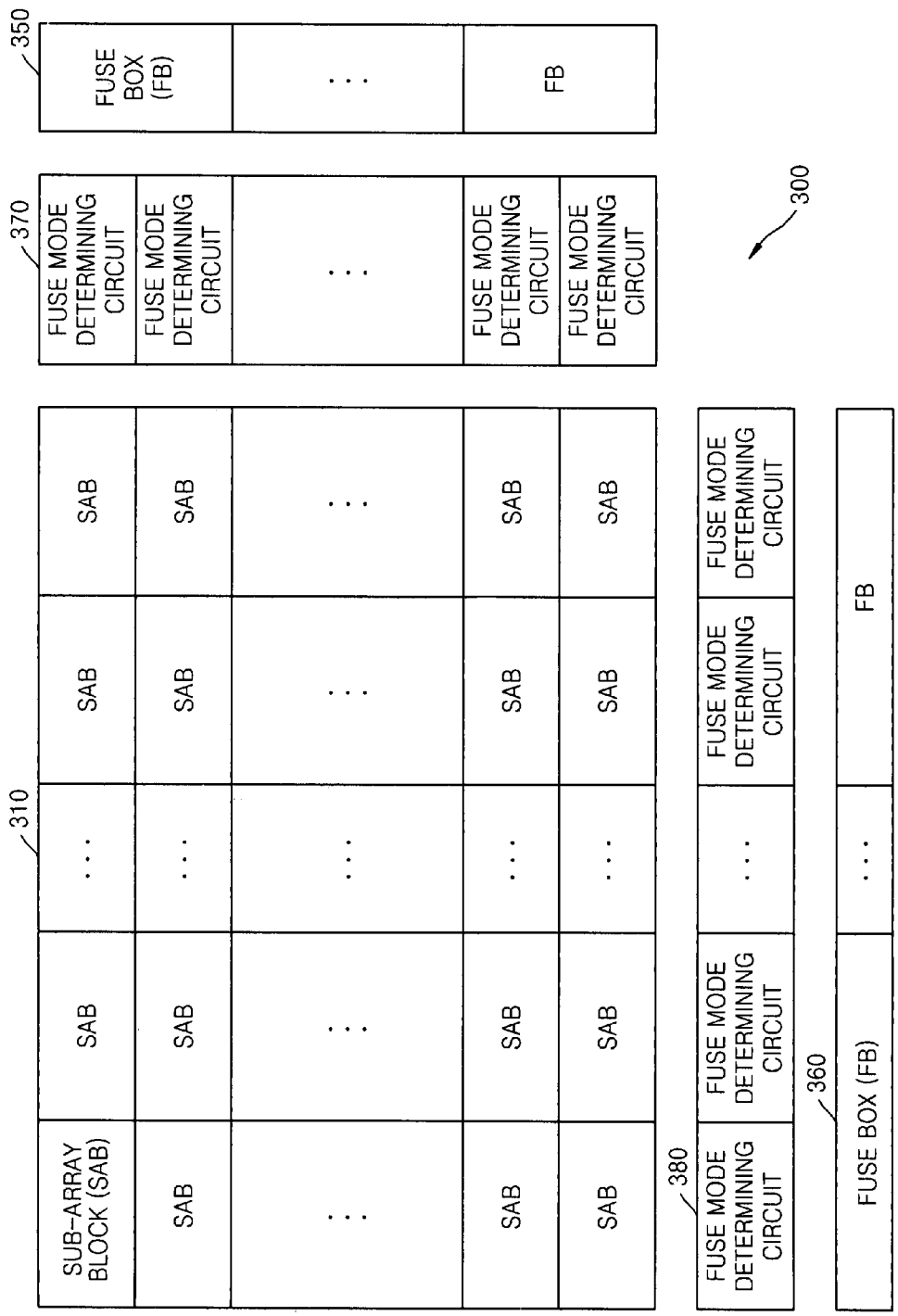
FIG. 3 is a block diagram of a semiconductor memory device according to example embodiments.

FIG. 3 is a block diagram of a semiconductor memory device 300 according to example embodiments. Referring to FIG. 3, the semiconductor memory device 300 may include a memory cell array 310 and two sets 350 and 360 of fuse boxes (FBs). The memory cell array 310 may include a plurality of sub-array blocks (SABs), and each SAB may include normal cells and redundancy cells. Of the two sets 350 and 360 of fuse boxes (FBs), each FB may include a plurality of fuse groups, each fuse group having a plurality of fuses. Each FB may correspond to (e.g., determine the address of) one or more sub-array blocks (SABs).

FIG. 3 illustrates an example where one FB may determine the row/column addresses of two SABs. Alternatively, each FB may correspond to more than two SABs. The semiconductor memory device 300 may also include two sets 370 and 380 of fuse mode determining circuits, wherein each fuse mode determining circuit determines the fuse mode (e.g., fuse-on-mode, fuse-off-mode) for a repair operation of a corresponding SAB.

FIGS. 4A and 4B are views illustrating the structure of a FB of FIG. 3 according to example embodiments. Referring to FIG. 4A, the FB may correspond to two SABs and may include a first fuse group and a second fuse group, each fuse group having a plurality of fuses. The first fuse group may correspond to one SAB and may include fuses 410_1, 410_2, 410_3, 410_4, 410_5, and 410_6. The second fuse group may correspond to the other SAB and may include fuses 420_1, 420_2, 420_3, 420_4, 420_5, and 420_6. Alternatively, a FB may include more than two fuse groups so as to correspond to more than two SABs. The fuses 410_1 to 410_6 of the first fuse group and the fuses 420_1 to 420_6 of the second fuse group may be arranged alternately such that the fuses of the same fuse group are not adjacent to each other. Alternatively, each fuse group may employ more than six fuses. Additionally, where more than two fuse groups are employed, the plurality of fuses of the different fuse groups may be arranged intermittently such that the fuses of the same fuse group are not adjacent to each other.

The first fuse group may also have a master fuse MF_410, and the second fuse group may have a master fuse MF_420. Alternatively, additional master fuses may be provided where more than two fuse groups are employed. The pitch size (amount of space between fuses) of the master fuses MF_410 and MF_420 may be greater than the pitch size of the fuses 410_1 to 410_6 and 420_1 to 420_6. For example, the pitch size of the master fuses MF_410 and MF_420 may be at least two times greater than the pitch size of the fuses 410_1 to 410_6 and 420_1 to 420_6. The integrity (e.g., not cut, cut) of the master fuse MF_410 may affect the determination of the fuse mode (e.g., fuse-on-mode, fuse-off-mode) for a repair operation of the SAB corresponding to the first fuse group. Similarly, the integrity of the master fuse MF_420 may affect the determination of the fuse mode for a repair operation of the SAB corresponding to the second fuse group. The determination of the fuse mode may be performed by a fuse mode determining circuit, which will be described in more detail with respect to FIG. 5.

For example, repairing a SAB corresponding to the first fuse group may require cutting (e.g., by laser) the fuse 410_3 of the first fuse group. However, as shown in FIG. 4A, the spot 430 of a laser beam may be of a size such that it includes the fuse 410_3 of the first fuse group (which corresponds to the SAB needing repair) as well as adjacent fuses 420_2 and 420_3 of the second fuse group (which corresponds to a different SAB not needing repair). Consequently, cutting fuse 410_3 and fuses 420_2 and 420_3 may result in a fuse-on-mode for the repair operation of the SABs corresponding to the first and second fuse groups, respectively. Because repair of the SAB corresponding to the second fuse group is not needed in this example although fuses 420_2 and 420_3 of the second fuse group have been cut, master fuse MF_420 of the second fuse group may be additionally cut so as to result in a fuse-off-mode regarding the SAB corresponding to the second fuse group. Furthermore, because the repair of the SAB corresponding to the first fuse group is needed in this example, master fuse MF_410 is not cut, thus resulting in a fuse-on-mode regarding the SAB corresponding to the first fuse group. As mentioned above, the determination of the fuse mode may be performed by a fuse mode determining circuit, which will be described in more detail with respect to FIG. 5.

According to example embodiments, a laser having a relatively small spot size, which may be expensive, may not be needed to repair a SAB, thus reducing costs. Additionally, the pitch size of the fuses may not need to be increased to accommodate the relatively large spot size of a conventional laser, thus decreasing the size of the FB. Furthermore, a laser having a larger spot size than the conventional art may be used to repair a SAB because of the fuse arrangement according to example embodiments.

Referring to FIG. 4B, the FB may include a first fuse group and a second fuse group similar to the FB shown in FIG. 4A. The first fuse group may correspond to a SAB and may include fuses 450_1, 450_2, 450_3, 450_4, 450_5, and 450_6. The second fuse group may correspond to another SAB and may include fuses 460_1, 460_2, 460_3, 460_4, 460_5, and 460_6. The first fuse group may also include a master fuse MF_450, and the second fuse group may include a master fuse MF_460. One difference between the FB of FIG. 4B and the FB of FIG. 4A is that the pitch size of the fuses in the FB of FIG. 4B are smaller than the pitch size of the fuses in the FB of FIG. 4A.

A repair operation with respect to FIG. 4B is similar to the repair operation described with respect to FIG. 4A. FIG. 4B illustrates an example where repairing a SAB corresponding to the first fuse group may require cutting the fuse 450_2 of the first fuse group. However, as shown in FIG. 4B, the spot 470 of a laser beam may be of a size such that it includes the fuse 450_2 of the first fuse group (which corresponds to the SAB needing repair) as well as adjacent fuses 460_1 and 460_2 of the second fuse group (which corresponds to a different SAB not needing repair). Because fuses 460_1 and 460_2 of the second fuse group have been cut even though repair of the SAB corresponding to the second fuse group is not needed, the master fuse MF_460 of the second fuse group may be cut so as to result in a fuse-off-mode regarding the SAB corresponding to the second fuse group. Additionally, because the fuse 450_2 of the first fuse group has been cut and repair of the SAB corresponding to the first fuse group is needed, the master fuse MF_450 is not cut so as to result in a fuse-on-mode. Accordingly, the relatively small pitch size of the fuses in FIG. 4B may decrease the size of the fuse box without hindering the proper repair operation of a SAB. Thus, when a conventional laser is used for a repair operation, the fuse box according to example embodiments may be smaller than a conventional fuse box.

Figure 5:
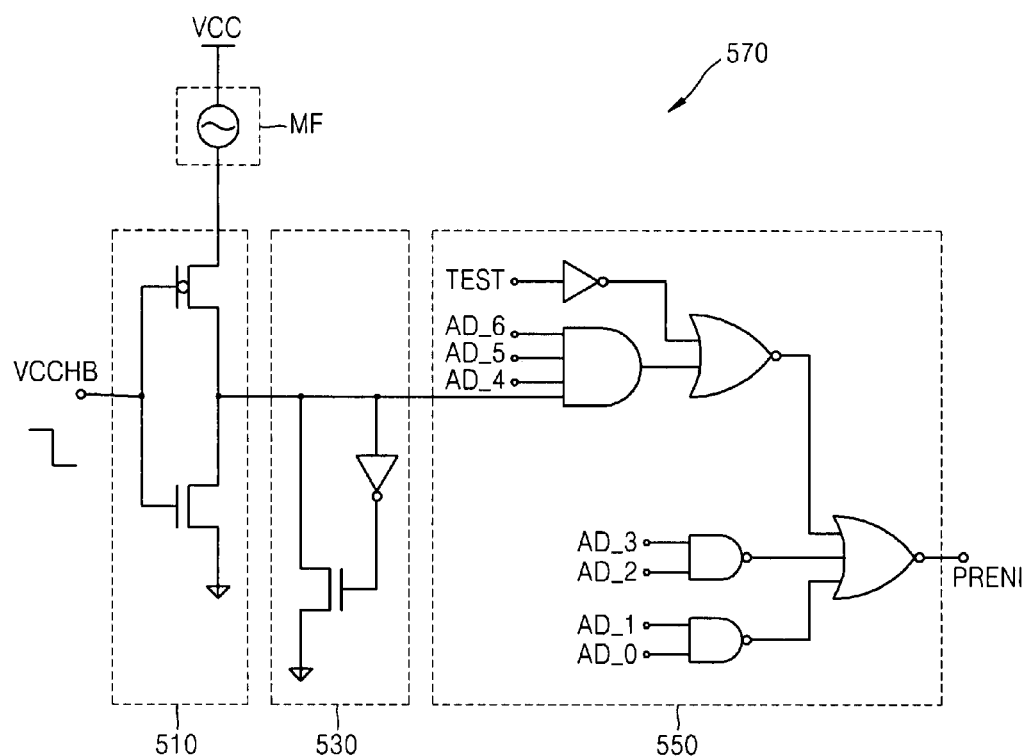
FIG. 5 is a circuit diagram of a fuse mode determining circuit of FIG. 3 according to example embodiments.

FIG. 5 is a circuit diagram of the fuse mode determining circuit of FIG. 3. The fuse mode determining circuits in the two sets 370 and 380 of fuse mode determining circuits in FIG. 3 may have the same structure. Accordingly, only one of the fuse mode determining circuits from set 370 will be discussed. Referring to FIG. 5, the fuse mode determining circuit 570 may include an inverter 510, a latch part 530, and a logic gate 550. The inverter 510 may output an input signal VCCHB in different logic state depending on the integrity status (e.g., not cut, cut) of the master fuse (MF). For example, the input signal VCCHB may have an initial first logic state (e.g., high logic state) that is changed to a second logic state (e.g. low logic state). The latch part 530 may latch the output signal of the inverter 510. The logic gate 550 may logically sum the output signal of the latch part 530 and address data AD_0 to AD_6 so as to output a redundancy enable signal PRENI, which signals a fuse-on-mode or a fuse-off-mode for a repair operation.

The example operation of the fuse mode determining circuit 570, when the master fuse MF has been cut, will be discussed below. Because the input signal VCCHB may have an initial first logic state (e.g., high logic state), the output signal of the inverter 510 may be in a second logic state (e.g., low logic state). The latch part 530 receives the output signal of the inverter 510 in the second logic state and latches it so as to output a signal in a second logic state. When the master fuse MF is cut, the output signal of the inverter 510 may be in a floating state, and the latch part 530 outputs a latched signal at an initial value of the input signal VCCHB. When a TEST signal determines either one of the fuse-on-mode and the fuse-off-mode, the TEST signal may be in a first logic state. Therefore, an output signal PRENI of the logic gate 550 may maintain a second logic state irrespective of the logic state of the address data AD_0 to AD_6. When the redundancy enable signal PRENI outputted by the logic gate 550 is in a second logic state, the fuse mode is determined to be a fuse-off-mode.

In contrast, when the master fuse MF is not cut, the redundancy enable signal PRENI may be in a first logic state, and the fuse mode may be determined to be a fuse-on-mode. Therefore, when the master fuse MF is not cut, the address for a repair operation may be determined by fusing the corresponding fuses according to the address data AD_0 to AD_6.

FIG. 6 is a flow chart illustrating a method of arranging fuses in a FB of a semiconductor memory device according to example embodiments. The flow chart of FIG. 6 may be explained in conjunction with FIGS. 3 and 4A. A fuse group corresponding to a SAB and having a plurality of fuses may be set in a FB (S610). The FB may include a first fuse group and a second fuse group. The first fuse group may correspond to a SAB and may include fuses 410_1 to 410_6. The second fuse group may correspond to another SAB and may include fuses 420_1 to 420_6. The first fuse group may also include a master fuse MF_410, and the second fuse group may include a master fuse MF_420 (S620).

A fuse-on-mode/fuse-off-mode for the repair operation of a SAB may be determined in accordance with the corresponding fuse group (S630). The master fuse MF_410 may be used to determine a fuse-on-mode/fuse-off-mode for the first fuse group. Similarly, the master fuse MF_420 may be used to determine a fuse-on-mode/fuse-off-mode for the second fuse group. When one or more of the fuses 410_1 to 410_6 of the first fuse group are cut and the master fuse MF_410 of the first fuse group is not cut, the first fuse group may be determined to be in a fuse-on-mode. On the other hand, when fuses 420_1 to 420_6 of the second fuse group are cut and the master fuse MF_420 of the second fuse group is also cut, the second fuse group may be determined to be in a fuse-off-mode, regardless of the fact that one or more fuses 420_1 to 420_6 of the second fuse group have been cut.

The plurality of fuses of the plurality of fuse groups may be intermittently arranged in the FB such that fuses of the same group are not adjacent to each other (S640). For example, the fuses 410_1 to 410_6 of the first fuse group and fuses 420_1 to 420_6 of the second fuse group may be alternately arranged such that fuses of the first fuse group are not adjacent to each other.

While example embodiments have been disclosed herein, it should be understood that other variations may be possible. Such variations are not to be regarded as a departure from the spirit and scope of example embodiments of the present invention, and all such modifications as would be obvious to one skilled in the art are intended to be included within the scope of the following claims.

What is claimed is:

1. A semiconductor memory device comprising:
    a memory cell array including a plurality of sub-array blocks; and
    at least one fuse box including a plurality of fuse groups, each fuse group having a plurality of fuses and corresponding to one of the plurality of sub-array blocks, wherein the plurality of fuses of the plurality of fuse groups are arranged intermittently such that the plurality of fuses in the same fuse group are not adjacent to each other,
    wherein each of the plurality of fuse groups further comprises at least one master fuse, wherein the integrity of the at least one master fuse of a fuse group affects the determination of a fuse mode for a repair operation of a sub-array block corresponding to the fuse group, and
    wherein the fuse box includes a plurality of master fuses, and a pitch size between the plurality of master fuses is greater than a pitch size between the plurality of fuses in the fuse box.

2. The semiconductor memory device of claim 1, wherein the plurality of fuse groups in a fuse box includes two fuse groups.

3. The semiconductor memory device of claim 2, wherein the plurality of fuses of the two fuse groups are arranged alternately.

4. The semiconductor memory device of claim 1, wherein the fuse mode is a fuse-on-mode when the at least one master fuse of the fuse group has not been cut.

5. The semiconductor memory device of claim 1, wherein the fuse mode is a fuse-off-mode when the at least one master fuse of a fuse group has been cut even though one or more fuses of the fuse group have also been cut.

6. The semiconductor memory device of claim 1, wherein the pitch size between the plurality of master fuses is at least two times greater than the pitch size between the plurality of fuses in the fuse box.

7. The semiconductor memory device of claim 1, further comprising a fuse mode determining circuit that determines a fuse mode by outputting a redundancy enable signal in response to the integrity status of the at least one master fuse.

8. The semiconductor memory device of claim 7, wherein the fuse mode determining circuit determines a fuse-on-mode when the at least one master fuse is not cut and outputs the redundancy enable signal at a first logic state.

9. The semiconductor memory device of claim 7, wherein the fuse mode determining circuit determines a fuse-off-mode when the at least one master fuse is cut and outputs the redundancy enable signal at a second logic state.

10. A method of arranging fuses in a fuse box of a semiconductor memory device, comprising:
    providing a memory cell array including a plurality of sub-array blocks;
    providing at least one fuse box including a plurality of fuse groups, each fuse group having a plurality of fuses and corresponding to one of the plurality of sub-array blocks;
    providing at least one master fuse corresponding to one of the plurality of fuse groups, wherein the integrity of the at least one master fuse of the fuse group affects the determination of a fuse mode for a repair operation of a sub-array block corresponding to the fuse group; and
    arranging the plurality of fuses of the plurality of fuse groups intermittently such that the plurality of fuses in the same fuse group are not adjacent to each other,
    wherein the fuse box includes a plurality of master fuses, and a pitch size between the plurality of master fuses is greater than a pitch size between the plurality of fuses in the fuse box.

11. The method of claim 10, wherein the plurality of fuse groups in a fuse box includes two fuse groups, and the plurality of fuses of the two fuse groups are arranged alternately.

12. The method of claim 10, further comprising:
    determining a fuse mode for a repair operation of a sub-array block in response to the integrity status of the at least one master fuse of the fuse group corresponding to the sub-array block.

13. The method of claim 12, wherein the fuse mode is determined to be a fuse-on-mode when the at least one master fuse of the fuse group has not been cut.

14. The method of claim 12, wherein the fuse mode is determined to be a fuse-off-mode when the at least one master fuse of a fuse group has been cut even though at least one of the plurality of fuses of the fuse group have also been cut.

15. A semiconductor memory device comprising:
    a memory cell array including a plurality of sub-array blocks;
    at least one fuse box including a plurality of fuse groups, each fuse group having a plurality of fuses and corresponding to one of the plurality of sub-array blocks, wherein the plurality of fuses of the plurality of fuse groups are arranged intermittently such that the plurality of fuses in the same fuse group are not adjacent to each other, wherein each of the plurality of fuse groups further comprises at least one master fuse, wherein the integrity of the at least one master fuse of a fuse group affects the determination of a fuse mode for a repair operation of a sub-array block corresponding to the fuse group; and a fuse mode determining circuit that determines a fuse mode by outputting a redundancy enable signal in response to the integrity status of the at least one master fuse, wherein the fuse mode determining circuit includes:

an inverter outputting an input signal after changing a logic state of the input signal depending on the integrity status of the at least one master fuse;

a latch part latching the changed input signal outputted by the inverter; and a logic gate outputting a redundancy enable signal by logic operation of an output signal of the latch part and address data.

\* \* \* \* \*